United States Patent
Kahlman et al.

(10) Patent No.: US 6,225,921 B1
(45) Date of Patent: May 1, 2001

(54) DEVICE FOR ENCODING/DECODING N-BIT SOURCE WORDS INTO CORRESPONDING M-BIT CHANNEL WORDS, AND VICE VERSA

(75) Inventors: Josephus A. H. M. Kahlman; Kornelis A. Schouhamer Immink; Gijsbert J. Van Den Enden, all of Eindhoven (NL); Toshiyuki Nakagawa, Tokyo (JP); Yoshihide Shimpuku, Tokyo (JP); Tatsuya Narahara, Tokyo (JP); Kousuke Nakamura, Tokyo (JP)

(73) Assignees: U.S. Philips Corporation, New York, NY (US); Sony Corporation, Tokyo (JP)

( * ) Notice: Subject to any disclaimer, the term of this patent is extended or adjusted under 35 U.S.C. 154(b) by 0 days.

(21) Appl. No.: 09/177,957

(22) Filed: Oct. 23, 1998

(30) Foreign Application Priority Data

Oct. 29, 1997 (EP) .................................................. 97202563
Feb. 10, 1998 (EP) .................................................. 98200405

(51) Int. Cl.[7] .............................. H03M 5/00; H03M 7/00
(52) U.S. Cl. ................................................ 341/58; 341/59
(58) Field of Search ................................ 341/58, 59, 73; 375/366, 368; 360/40

(56) References Cited

U.S. PATENT DOCUMENTS

| | | |
|---|---|---|
| 4,641,128 | 2/1987 | Schouhamer Immink . |
| 4,728,929 * | 3/1988 | Tanaka .................................... 341/73 |
| 5,142,421 * | 8/1992 | Kahlman et al. ....................... 360/40 |
| 5,477,222 | 12/1995 | Kahlman et al. . |

\* cited by examiner

Primary Examiner—Patrick Wamsley
(74) Attorney, Agent, or Firm—Michael E Belk (57) ABSTRACT

A device is disclosed for encoding a stream of databits of a binary source signal (S) into a stream of databits of a binary channel signal (C) satisfying a (d,k) constraint, wherein the bitstream of the source signal is divided into n-bit source words ($x_1$, $x_2$), which device comprises converting means (CM) adapted to convert said source words into corresponding m-bit channel words ($Y_1, Y_2, Y_2$). The converting means (CM) are further adapted to convert n-bit source words into corresponding m-bit channel words, such that the conversion for each n-bit source word is parity preserving (table I). The relations hold that $m > n \geq 1$, $p \geq 1$, and that p can vary. Preferably, $m = n + 1$. Further, a sync word generator (9) is available for generating a q-bit sync word also satisfying said (d,k) constraint, the said sync word starting with a '0' bit and ending with a '0' bit, the device further comprising merging means (19) for merging said sync word in said stream of databits of the binary channel signal, and that q is an integer value larger than k. (FIG. 1)

Further, a decoding device is disclosed for decoding the channel signal obtained by means of the encoding device.

46 Claims, 4 Drawing Sheets

DEVICE FOR ENCODING/DECODING N-BIT SOURCE WORDS INTO CORRESPONDING M-BIT CHANNEL WORDS, AND VICE VERSA

The invention relates to a device for encoding a stream of databits of a binary source signal into a stream of databits of a binary channel signal satisfying a predetermined (d,k) constraint, wherein the bitstream of the source signal is divided into n-bit source words, which device comprises converting means adapted to convert said source words into corresponding m-bit channel words, the converting means being adapted to convert a block of p consecutive n-bit source words into a corresponding block of p consecutive m-bit channel words, such that the conversion for each block of p consecutive n-bit source words is substantially parity preserving, where n, m and p are integers, $m > n \geq 1$, $p \geq 1$, and where p can vary. The invention also relates to a recording device comprising the encoding device for recording the channel signal on a record carrier, to the record carrier itself, to an encoding method, and to a device for decoding a stream of data bits of a binary channel signal obtained by means of the encoding device, so as to obtain a stream of data bits of a binary source signal.

An encoding device mentioned in the foregoing is known from U.S. Pat. No. 5,477,222 (PHN 14448). The document discloses a device for encoding a stream of data bits of a binary source signal into a stream of data bits of a binary channel signal satisfying a (1,8) runlength constraint. That means that, in the serial datastream of the channel signal at minimum one 'zero' and at maximum eight 'zeroes' are present between two consecutive 'ones' in the channel signal. It should be noted in this respect that normally an additional precoding, such as a well known 1T precoding is applied to the (1,8) d,k constrained sequence, resulting in a runlength limited sequence with minimum runlength 2 and maximum runlength 9.

The known conversion is parity preserving. 'Parity preserving' means that the parity of the n-bit source words to be converted equal the parity (after modulo-2 addition) of the corresponding m-bit channel words in which they are converted. As a result, the n-to-m conversion device as claimed does not influence the polarity of the signal.

As the conversion is parity preserving, an efficient DC control can be applied, such as by inserting Dc control bits in the datastream of the source words.

The invention has for its object to provide for an appropriate sync word to be inserted into the serial datastream of the channel signal.

The device in accordance with the invention is characterized in that the device comprises sync word generator means for generating a q-bit sync word also satisfying said (d,k) constraint, the said sync word starting with a '0' bit and ending with a '0' bit, the device further comprising merging means for merging said sync word in said stream of databits of the binary channel signal, and that q is an integer value larger than k.

It is well known in the art to add sync words to a serial datastream of a channel signal. Reference is made in this respect to WO 96/31,880. The sync word proposed violates the prescribed k constraint. This has its disadvantages in that a relatively long sync word is required, that is more prone to error and results in a relatively large overhead.

In accordance with the invention, a q-bit sync word is proposed, such that, after combining the sequence of channel words with the sync word, the signal obtained satisfies said (d,k) constraint. This has the advantage that a shorter sync word is required, resulting in a smaller overhead. Further, as the said sync word starts with a '0' bit and ends with a '0' bit, it can be merged between any m-bit channel word, eg. when taking d equal to 1.

Preferably, the sync word starts with a '01' bitsequence and ends with a '10' sequence. This provides for satisfying the k constraint.

In an embodiment, in which the encoding device generates a channel signal satisfying the constraint d=1, preferably a 15-bit sync word is used, such as the sync word '010000000010010'. When k=8, this sync word satisfies the formula $q = 2k - 1$, and is very efficient, even when compared with eg other sync words that do not violate the d,k constraints of the signals they are merged in, such as disclosed in U.S. Pat. No. 4,501,000 (PHQ 80.007). It should however be noted that the sync word defined above could be equally well used in an encoding device supplying an output datastream satisfying another k-constraint, such as k=7 or lower (so that the sync word does not satisfy the k constraint of the encoded signal), or k larger than 8.

In another embodiment, a sync word is generated starting with a '01' bitsequence and ending with a '100' bitsequence, such as the 16-bit sync word '0100000000100100'.

In again another embodiment, a sync word is generated starting with a '01' bitsequence and ending with a '1000' bitsequence, such as the 17-bit sync word '01000000001001000'.

In a further embodiment, a sync word is generated starting with a '01' bitsequence and ending with a '10000' bitsequence, such as the 18-bit sync word '010000000010010000'.

For certain n-to-m conversions, the sync words ending with two or more 'zeroes' may lead, after concatenation with a subsequent channel word and with an unmodified encoding, to a violation of the k-constraint. This can be overcome by changing the conversion, so that the k-constraint is satisfied, with a local violation of the parity preserving property.

The encoding device in accordance with the invention can be used in combination with a bit-adder unit in which one bit is added to codewords of a certain length of the source signal. The signal obtained can be applied to the encoding device of the present invention. The channel signal of the encoding device is applied to a 1T-precoder. The purpose of the bit-adder unit is to add a '0'- or a '1'-bit to the consecutive code words included in the input signal of the converter, so as to obtain a precoder output signal which is DC free, or includes a tracking pilot signal having a certain frequency. The precoder output signal is recorded on a record carrier. The adding of a '0'-bit in the input signal of the converter results in the polarity of the output signal of the 1T precoder remaining the same. The adding of a '1'-bit results in a polarity inversion in the output signal of the 1T precoder. The converter therefore influences the output signal of the 1T precoder such that the running digital sum value of the output signal of the 1T precoder can be controlled so as to have a desired pattern as a function of time.

The invention will be further described in the following figure description, in which FIG. 3a shows a second, FIG. 3b a third.

Figure 1:
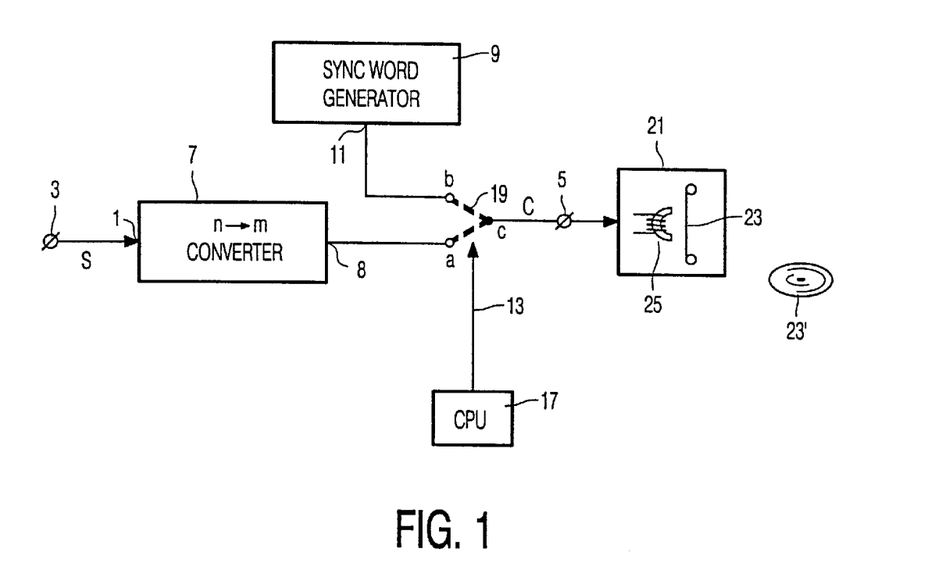
FIG. 1 shows an embodiment of the device in accordance with the invention.

FIG. 1 shows a device for encoding a stream of databits of a binary source signal into a stream of databits of a binary channel signal satisfying a predetermined (d,k) constraint. The device has an input terminal 3 for receiving the binary source signal and an output terminal 5 for supplying the channel signal that satisfies the (d,k) constraint. The device comprises an n-to-m bit converter 7 having an input 1 coupled to the input terminal 3 and an output 8 coupled to a first terminal a of a controllable switch 19. The converter 7 is adapted to divide the input bitstream into n-bit source words and converts said source words into corresponding m-bit channel words. More precisely, the converter 7 converts a block of p consecutive n-bit source words into a corresponding block of p consecutive m-bit channel words, such that the conversion for each block of p consecutive n-bit source words is parity preserving. n, m and p are integers, m>n≧1, p≧1, and p can vary, as will become clear later. The device further comprises a sync word generator 9 for generating a q-bit sync word also satisfying said (d,k) constraint. q is an integer value larger than k. An output 11 of the sync word generator 9 is coupled to a terminal b of the controllable switch 19. A terminal c of the switch 19 is coupled to the output terminal 5 of the device. The switch can be controlled in one of two switch positions, a-c and b-c, under the influence of a switching control signal on the line 13, generated by a central processing unit 17.

In the switch position a-c, the device converts the source signal into the channel signal and in the position b-c, a sync word can be inserted into the channel signal. The insertion of a sync word can repeatedly take place at 'equidistant' positions in the channel signal, where a sync word is merged into the channel signal, each time between two m-bit successive channel words. It will be clear that the processing unit 17 also controls the converter 7, so as to halt the conversion at the time instant that a sync word is merged into the serial datastream of the channel signal.

At this moment, it can be said that the sync word starts with a '0' bit and ending with a '0' bit. First, the functioning of the converter 7 will be further explained.

The encoding device of FIG. 1 could further be provided with a writing unit 21 for writing the channel signal generated by the encoding device in a track on a record carrier 23. The record carrier 23 can be a magnetic or an optical record carrier. In the example of a magnetic record carrier 23, the writing unit 21 is provided with at least one magnetic head 25 for writing the channel signal in said track on the record carrier 23. In the example of an optical record carrier 23', the writing unit 21 is provided with a light source, such as a laser, for writing the information in the record carrier 23'.

Figure 2:
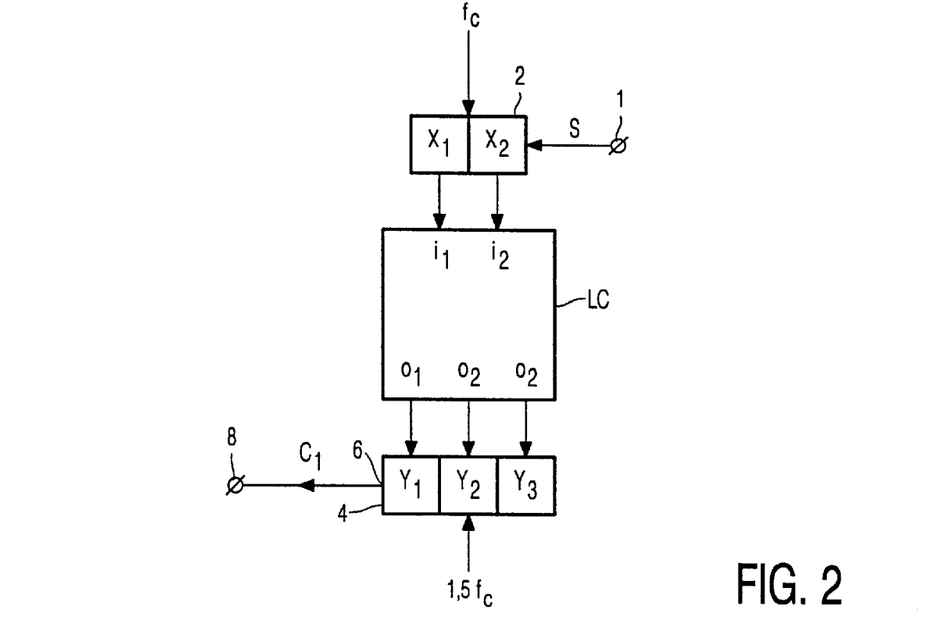
FIG. 2 shows a first elaborated version of the converter in the device.

FIG. 2 shows a first elaborated version of the converter 7. The terminal 1 of the converter is coupled to an input of a shift register 2 having two cells $X_1$ and $X_2$ so as to receive two consecutive source bits of the source signal S. The shift register 2 functions as a serial-parallel converter, so as to obtain consecutive 2-bit source words SW. The outputs of the two cells are coupled to two inputs $i_1$, $i_2$ of a logic circuit LC, for supplying the logic values $(x_1,x_2)$ of the source bits present in the cells.

The converter 7 further includes a second shift register 4 having three cells $Y_1$, $Y_2$ and $Y_3$. Outputs $o_1$, $o_2$ and $o_3$ of the logic circuit LC are coupled to inputs of the three cells $Y_1$, $Y_2$ and $Y_3$ respectively of the shift register 4, for supplying the logic values $(y_1,y_2,y_3)$ of the channel words. An output 6 of the shift register 4 is coupled to an output terminal 8. The shift register 4 functions as a parallel-serial converter, so as to convert the 3-bit channel words CW supplied by the logic circuit LC into a serial stream of databits of a binary converted signal $C_1$.

The logic circuit LC is adapted to convert consecutive 2-bit source words SW into 3-bit channel words, such that the conversion for each 2-bit source word is parity preserving. That means that the number of 'ones' in the source word to be converted equals the number of 'ones' in the corresponding channel word, a modulo-2 addition on the 'ones' in the channel word being carried out. Or, otherwise said: if the number of 'ones' in the source word is even, the number of 'ones' in the channel word will be even. And: if the number of 'ones' in the source word is odd, the number of 'ones' in the channel word will be odd.

As an example, the converting means LC is adapted to convert the 2-bit source words SW into 3-bit channel words CW in accordance with the following table:

TABLE I

| source word $(x_1,x_2)$ | | channel word $(y_1,y_2,y_3)$ | |
|---|---|---|---|
| $SW_1$ | 00 | $CW_1$ | 101 |
| $SW_2$ | 01 | $CW_2$ | 100 |
| $SW_3$ | 10 | $CW_3$ | 001 |
| $SW_4$ | 11 | $CW_4$ | 000 |

It should be noted here, that the first bit in the source word is applied first to the shift register 2 and that the first bit in the channel word is supplied first from the output 6 of the shift register 4.

The bitstream of the channel words is in NRZI (non-return to zero-inverse) notation, which means that a 'one' results in a transition in the write current for recording the channel signal on a magnetic record carrier.

The converter of FIG. 2 can be used to generate a converted signal $C_1$ in the form of a (d,k) sequence satisfying the d=1 constraint. That means that at least one 'zero' is present between two subsequent 'ones' in the serial datastream of the converted signal $C_1$. That is, that a concatenation of two or more 'ones' in the converted signal $C_1$, and thus in the channel signal C, is prohibited.

It might occur that the unmodified conversion, such as by means of the device of FIG. 1, of combinations of two subsequent 2-bit source words might violate the d=1 constraint. Those combinations are the combinations; '00 00', which by unmodified conversion would lead to the two 3-bit channel words '101 101'; '00 01', which by unmodified conversion would lead to the two 3-bit channel words '101 100'; '10 00', which by unmodified conversion would lead to the two 3-bit channel words '001 101' and '10 01', which by unmodified conversion would lead to the two 3-bit channel words '001 100'.

The occurrence of such combinations should be detected so that a modified encoding of blocks of two 2-bit source words into blocks of two 3-bit channel words can take place. A modified embodiment of a converter of FIG. 2 which is, in addition to the 'normal' encoding of 2-bit source words into 3-bit channel words, capable of detecting the above identified combinations, and is capable of realizing a modified encoding, such that the d=1 constraint in the converted signal $C_1$, and thus in the channel signal C, is still satisfied, is shown in FIG. 3a.

Figure 3A:
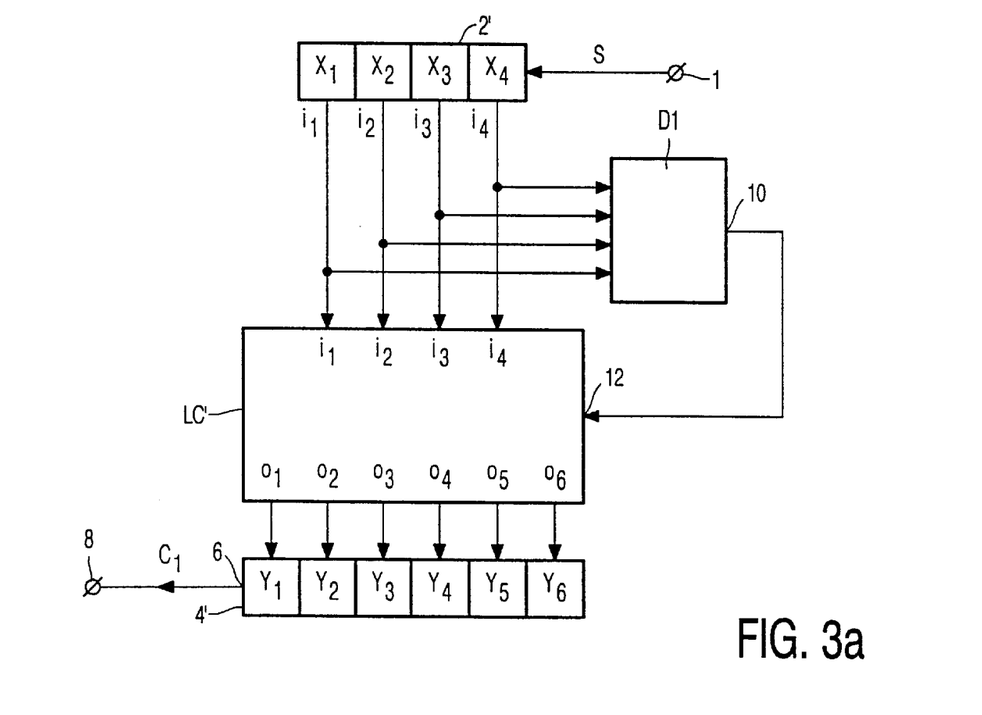

The converter of FIG. 3a includes a shift register having four cells $X_1$ to $X_4$ so as to receive four consecutive bits ($x_1,x_2,x_3,x_5$) of the serial bitstream of the source signal S. Outputs of the four cells are coupled to corresponding inputs $i_1$ to $i_4$ respectively of the logic circuit LC' as well as to corresponding inputs of a detector unit D1. The detector unit D1 is adapted to detect the position in the serial bitstream of the source signal where unmodified encoding of single source words in the bitstream into corresponding single channel words would lead to a violation of the d=1 constraint in the converted signal $C_1$, and are adapted to supply a control signal at its output 10 in response to such detection.

The output 10 of the detector unit D1 is coupled to a control signal input of the logic circuit LC'. The logic circuit LC' has six outputs $o_1$ to $o_6$, which are coupled to inputs of cells $Y_1$ to $Y_6$ respectively of second shift register 4'.

In the absence of a control signal at the control signal input 12, the logic circuit LC' converts the first 2-bit source word '$x_1$ $x_2$' into the three bit channel word '$y_1$ $y_2$ $y_3$' in conformity with table I given above. As soon as the detector circuit D1 detects a combination of two 2-bit source words ($x_1x_2,x_3,x_5$) which equals one of the combinations given above, the logic circuit LC' converts the combination in accordance with the modified coding as given in the following table:

TABLE II

| source words | unmodified coding | modified coding |
|---|---|---|
| 00 00 | 101 101 | 100 010 |
| 00 01 | 101 100 | 101 010 |
| 10 00 | 001 101 | 000 010 |
| 10 01 | 001 100 | 001 010 |

As can be seen from the table, unmodified conversion of the single two 2-bit source words leads to a violation of the d=1 constraint, as two 'ones' occur at the boundary between the two channel words obtained. The logic circuit LC' is therefore adapted to convert in a modified coding mode, the blocks of two 2-bit source words given in the left column of the above table into the blocks of two 3-bit channel words as given in the right column in the above table II. As can be seen, no violation of the d=1 constraint occurs anymore. Moreover, the modified encoding in the same way is parity preserving. This means in the present situation that, if the number of 'ones' in the blocks of two 2-bit source words is odd (even), the number of 'ones' in the block of two 3-bit channel words obtained is odd (even). Further, one of the two 2-bit source words, which is in the above table the second one, is encoded into a 3-bit channel word which is unequal to one of the four channel words of table I. The reason for this is that on the receiver side, a detection of this 3-bit channel word not belonging to the set of four 3-bit channel words of the table I is possible, so that a corresponding decoding, which is the inverse of the encoding as defined with reference to table II, can be realized.

The block of two 3-bit channel words obtained by means of the encoding in conformity with table II, is supplied by the logic circuit LC' to its outputs $o_1$ to $o_6$, which channel words are supplied to the six cells $Y_1$, to $Y_6$ of the shift register 4'. It is clear from the embodiment described that the situations where a modified encoding is needed is detected by means of the detector D1 using the source words.

Figure 3B:
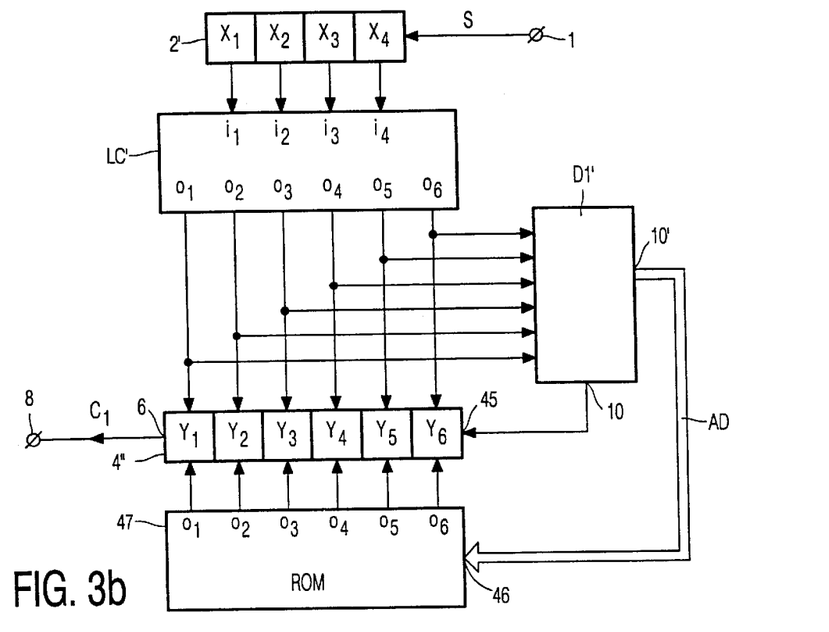

A different construction of the converter for carrying out the modified conversion described with reference to the table II is shown in FIG. 3b. In this case, detection of the situations where a modified coding should be carried out is decided using the converted channel words. The device of FIG. 3b includes a detector D1' having 6 inputs for receiving two subsequent 3-bit channel words obtained by means of the unmodified encoding. The detector D1' detects whether the two subsequent 3-bit channel words obtained using the unmodified coding equal one of the four 6-bit sequences given in the middle column under 'unmodified coding' of table II. If so, the detector D1' issues a switching signal at its output 10 and an address signal AD at its output 10'. The switching signal is applied to a switching signal input 45 of the shift register 4". The address signal AD is applied to an address signal input 46 of a ROM 47. The detector D1' generates one of four possible address signals AD1 to AD4, in response to the detection of a corresponding one of the four 6-bit sequences in the middle column of table II. As an example, the address signal AD1 is generated when the detector D1' detects the sequence '101101' and generates the address signal AD4 upon detection of the 6-bit sequence '001100'. The ROM 47 has the 6-bit sequences shown in the right column of table II stored. Upon the receipt of the address signal ADI, the ROM supplies the 6-bit sequence '100 010' at its outputs $o_1$ to $o_6$, and upon the receipt of the address signal AD2, the ROM supplies the 6-bit sequence '101 010' at its outputs. Upon the receipt of the address signal AD3, the ROM supplies the 6-bit sequence '000 010' at its out-puts, and upon the receipt of the address signal AD4, the ROM supplies the 6-bit sequence '001 010' at its outputs. Each memory location of the shift register 4" has now two inputs, one of them being coupled with a corresponding output of the logic circuit LC', the other being coupled to a corresponding output of the ROM 47.

In the normal situation, when the d=1 constraint is not violated, unmodified conversion is carried out, and the switching signal is absent so that the shift register accepts the bits supplied by the logic circuit LC' via the upper inputs of the shift register 4". If the d=1 constraint is violated, the switching signal applied to the switching signal input 45 results in the shift register to accept the 6-bit sequence, which is the modified sequence, applied by the ROM to the lower inputs of the shift register 4".

The k-constraint in a (d,k) sequence means that a concatenation of at most k'zeroes' between two subsequent 'ones' in the channel signal are allowed.

It might occur that the unmodified conversion of three subsequent 2-bit source words might violate the k-constraint.

As an example: the sequence of source words '11 11 11' would by unmodified conversion lead to the three 3-bit channel words '000 000 000'. If a (d,k) sequence should be obtained where k equals 6, 7 or 8, such combination of three 3-bit channel words should not occur.

Another example is the sequence of source words '11 11 10' which by unmodified conversion would lead to the three 3-bit channel words '000 000 001'. This combination of three 3-bit channel words does not satisfy a k=6 or k=7 constraint. Moreover, this combination of three 3-bit channel words can follow a previous channel word that ends with a '0', so that it might lead to a violation of a k=8 constraint. Further, the combination ends with a '1', so that it might lead to a violation of the d=1 constraint, if the combination is followed by a 3-bit channel word that starts with a '1'. An equivalent reasoning is valid for the sequence of source words '01 11 11'.

A further example is the sequence of source words '01 11 10' which by unmodified conversion would lead to the three 3-bit channel words '100 000 001'. This combination can, in the same way as given above, lead to a violation of the d=1 constraint.

The occurrence of such combinations should be detected so that a modified encoding can take place. An embodiment of a converter which is, in addition to the 'normal' encoding of 2-bit source words into 3-bit channel words, capable of detecting the above identified combinations, and is capable of realizing a modified encoding, is shown in FIG. 4.

Figure 4:
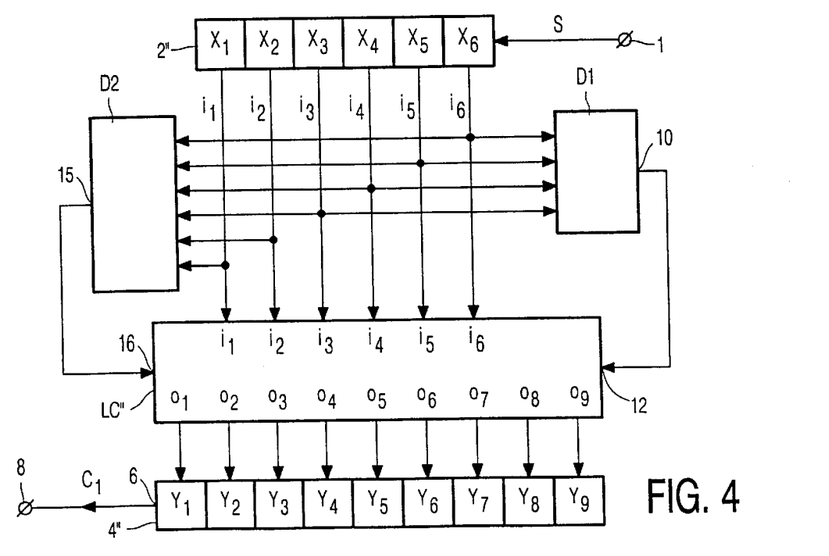
FIG. 4 shows a fourth elaborated version of the converter in the device, FIG. 5 the application of the device in accordance with the invention in an arrangement for inserting one bit on equidistant positions in the serial source signal, FIG. 6 an embodiment of the decoding device, and FIG. 7 an elaborated version of the converter unit of the decoding device of FIG. 6.

The converter of FIG. 4 includes a shift register $2''$ having six cells $X_1$ to $X_6$ so as to receive six consecutive bits of the serial bitstream of the source signal S. Outputs of the six cells are coupled to corresponding inputs $i_1$ to $i_6$ respectively of the logic circuit LC" and to corresponding inputs of a detector unit D2. The detector unit D2 is adapted to detect the position in the serial bitstream of the source signal where unmodified encoding of the bitstream would lead to a violation of the k-constraint in the converted signal $C_1$, and thus in the channel signal C, and is adapted to supply a control signal at its output 15 in response to such detection.

The output 15 of the detector unit D2 is coupled to a control signal input 16 of the logic circuit LC". The logic circuit LC" has nine outputs $o_1$ to $o_9$, which are coupled to inputs of cells $Y_1$ to $Y_9$ respectively of second shift register $4'''$.

In the absence of a control signals at the control signal inputs 12 and 16, the logic circuit LC" converts a single 2-bit source word '$x_1\ x_2$' into a single 3-bit channel word '$y_1\ y_2\ y_3$' in conformity with table I given above. As soon as the detector circuit D1 detects a block of two 2-bit source words '$x_1\ x_2,\ x_3\ x_4$' which equals one of the combinations given in table II above, the logic circuit LC" converts the combination in accordance with the conversion rule as given in table II, so as to obtain a block of two 3-bit channel words '$y_1\ y_2\ y_3\ y_4\ y_5\ y_6$'.

As soon as the detector D2 detects a block of three 2-bit source words '$x_1\ x_2\ x_3\ x_4,\ x_5\ x_6$' which equals one of the combinations given above, the logic circuit LC" converts the block in accordance with the modified coding as given in the following table, so as to obtain a block of three 3-bit channel words:

TABLE III

| source words | unmodified coding | modified coding |
| --- | --- | --- |
| 11 11 11 | 000 000 000 | 000 010 010 |
| 11 11 10 | 000 000 001 | 001 010 010 |
| 01 11 10 | 100 000 001 | 101 010 010 |
| 01 11 11 | 100 000 000 | 100 010 010 |

The logic circuit LC" is adapted to convert in a modified coding mode, the blocks of three 2-bit source words given in the left column of the above table III into the blocks of three 3-bit channel words as given in the right column in the above table. By realizing the modified encoding as per table III, a channel signal has been obtained which satisfies the k=8 constraint. Moreover, the modified encoding in the same way is parity preserving. Further, two of the three 2-bit source words, which is in the above table the second one and the third one, is encoded into a 3-bit channel word which is unequal to one of the four channel words of table I. The reason for this is that on the receiver side, a detection of these two consecutive 3-bit channel words not belonging to the set of four 3-bit channel words of the table I is possible, so that a corresponding decoding, which is the inverse of the encoding as defined with reference to table III, can be realized.

The combination of three 3-bit channel words obtained by means of the encoding in conformity with table III, is supplied by the logic circuit LC" to its outputs $o_1$ to $o_9$, which channel words are supplied to the nine cells $Y_1$ to $Y_9$ of the shift register $4''$. The serial datastream of the converted signal C1 is supplied to the output terminal 8.

It will be evident that, in the same way as described with reference to FIG. 3b, the detection of the violation of the k-constraint can be done on the converted signal level, instead of the source signal level.

It has been said previously that other conversion rules for converting single 2-bit source words into single 3-bit channel words are possible. Those conversion rules are given in the following three tables.

TABLE IV

| source word $(x_1,x_2)$ | | channel word $(y_1,y_2,y_3)$ | |
| --- | --- | --- | --- |
| $SW_1$ | 00 | $CW_1$ | 101 |
| $SW_2$ | 01 | $CW_2$ | 001 |
| $SW_3$ | 10 | $CW_3$ | 100 |
| $SW_4$ | 11 | $CW_4$ | 000 |

TABLE V

| source word $(x_1,x_2)$ | | channel word $(y_1,y_2,y_3)$ | |
| --- | --- | --- | --- |
| $SW_1$ | 00 | $CW_1$ | 000 |
| $SW_2$ | 01 | $CW_2$ | 100 |
| $SW_3$ | 10 | $CW_3$ | 001 |
| $SW_4$ | 11 | $CW_4$ | 101 |

TABLE VI

| source word $(x_1,x_2)$ | | channel word $(y_1,y_2,y_3)$ | |
| --- | --- | --- | --- |
| $SW_1$ | 00 | $CW_1$ | 000 |
| $SW_2$ | 01 | $CW_2$ | 001 |
| $SW_3$ | 10 | $CW_3$ | 100 |
| $SW_4$ | 11 | $CW_4$ | 101 |

It is evident that extensions of those conversion rules for encoding blocks of two or three 2-bit source words into blocks of two or three 3-bit channel words can be obtained using the teachings given above.

It should be noted that, although converters have been described converting 2-bit source words into 3-bit channel words, the invention is equally well applicable with converters converting (as an example) 3-bit source words into 4-bit channel words.

For the embodiment of the 2-to-3 bit converter 7 realizing a converted signal satisfying a (1,8) runlength constraint, the sync word generator 9 preferably generates a q-bit sync word that begins with '01' and ends with '10'. More specifically, the generator 9 generates a 15-bit sync word which equals '010000000010010'.

The advantages of the use of this sync word are:
  the sync word satisfies the (1,8) runlength constraint, so that the use of the sync word does not lead to a increase of the k-constraint of the (1,8) constrained parity preserving code.
  the sync word is a unique word in the sequence of the channel signal.
  as the sync word begins and ends with a '0' bit, it can always be merged between two 3-bit channel words.
  as the sync word is only 15 bits long, it implies a relatively low overhead.

The sync word defined above could equally well be used in parity preserving encoders that generate a sequence of channel words satisfying a different k-constraint, such as k=7. In this situation, the sync word, as such, violates the k constraint of the generated channel signal.

Figure 5:
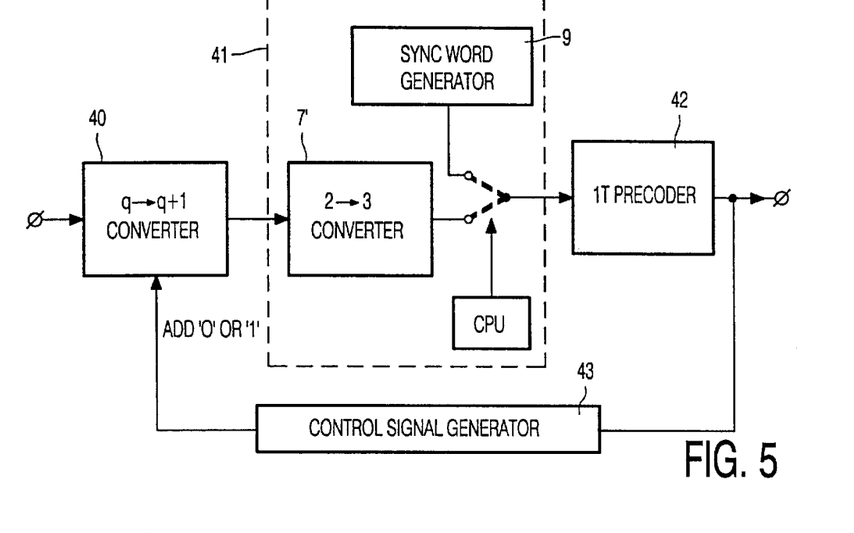

As has been said previously, the device in accordance with the invention can very suitably be used in an encoding arrangement where one bit is inserted after each group of a plurality of bits in the serial datastream of the source signal, in order to realize a polarity conversion, or not. Such an encoding arrangement is schematically shown in figure 5, where the encoder 40 is followed by the encoding device 41 in accordance with the present invention, and a 1T-precoder 42, well known in the art. The output signal of the 1T-precoder 42 is applied to a control signal generator 43, which generates the control signal for the converter 40, so as to control whether a '0' or a '1' is inserted in the serial datastream applied to the device 41. The encoding device 41 can be inserted between the converter 40 and the 1T-precoder 42 without any modification.

By means of the arrangement shown in FIG. 5 it is possible to embed a tracking tone of a certain frequency in the serial datastream, or keep the DC content of the datastream to zero. Further, when the encoding device 41 is adapted to generate a (d,k) sequence as explained above, it causes the output signal of the arrangement of FIG. 4 to be a (d,k) RLL output signal. Embodiments of the converter 40 are given in Bell System Technical Journal, Vol 53, No. 6, pp. 1103–1106.

Figure 6:
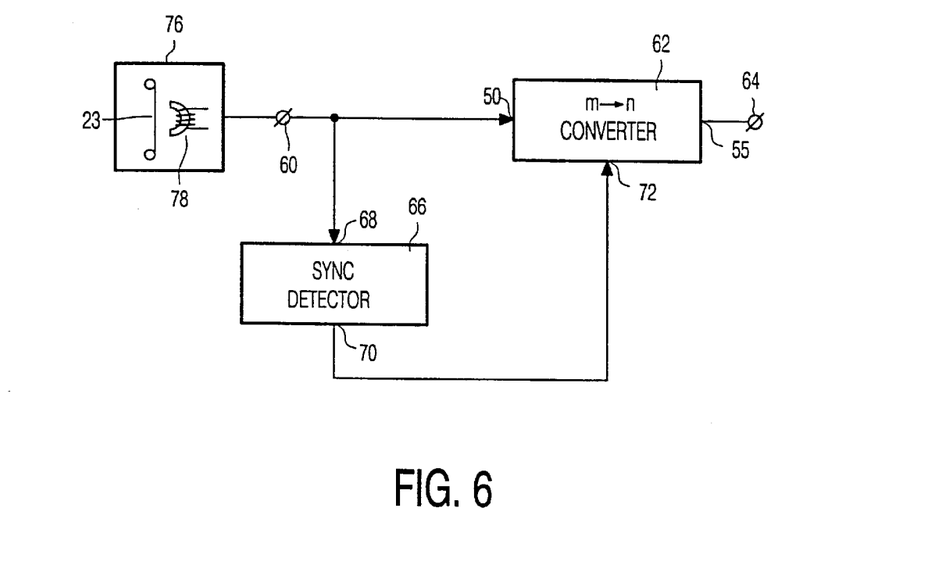

FIG. 6 shows a decoding device for decoding the serial datastream obtained by the encoding device, so as to obtain a binary source signal. The decoding device has an input terminal 60 for receiving the channel signal, which input terminal 60 is coupled to an input 50 of an m-to-n bit converter 62. An output 55 of the converter 62 is coupled to an output terminal 64 of the decoding device. The device further comprises a sync detector unit 66, having an input 68 coupled to the input terminal 60 and an output 70 which is coupled to a disable input 72 of the converter 62.

The decoder receives the channel signal with the m-bit channel words and the sync words via its input terminal 60. In the example of m=3 and n=2, 3-bits channel words are converted in the converter 62 into 2-bits source words and supplied to the output terminal 64. Upon reception of a sync word, this sync word is detected by the detector 66, and a disable signal is generated via the output 70 so as to disable the converter 62 during the time interval that the sync word appears at the input 50. Next, the converter 62 is enabled, so that the 3-bit channel words following the sync word can be converted into the 2-bit source words.

The decoding device of FIG. 6 could further be provided with a reading unit 76 for reading a channel signal from a track on the record carrier 23 generated by the encoding device of FIG. 1, provided with the writing unit 21. The record carrier 23 can be magnetic or an optical record carrier. In the example of a magnetic record carrier 23, the reading unit 76 is provided with at least one magnetic head 78 for reading the channel signal from said track on the record carrier 23.

Figure 7:
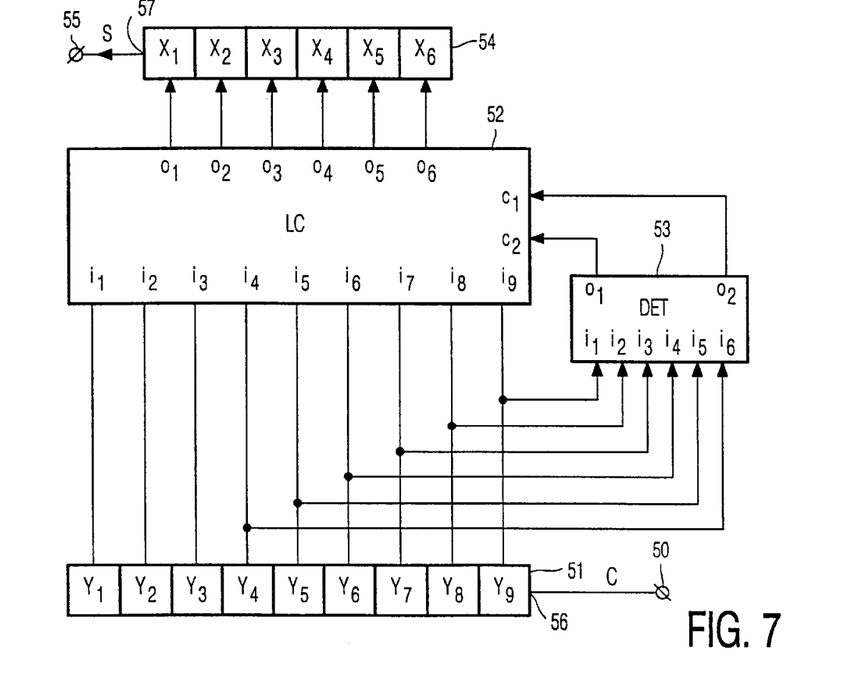

FIG. 7 shows an embodiment of the converter 62 of FIG. 6. The converter 62 comprises a shift register 51, comprising nine cells $Y_1$ to $Y_9$. The shift register 51 functions as a serial-parallel converter so that blocks of three 3-bit channel words are applied to inputs $i_1$ to $i_9$ of a logic circuit 52. The logic circuit 52 comprises the three tables I, II and III. Outputs $o_1$ to $o_6$ of the logic circuit 52 are coupled to inputs of cells $x_1$ to $x_6$ of a shift register 54, which has an output 57 coupled to an output terminal 55. A detector circuit 53 is present having inputs $i_1$ to $i_6$ coupled to outputs of cells $Y_4$ to $Y_9$ respectively of the shift register 51, and outputs $o_1$ and $o_2$ coupled to control inputs $c_1$ and $c_2$ respectively of the logic circuit 52. The detector circuit 53 is capable of detecting a '010' bit pattern in the cells $Y_4$, $Y_5$ and $Y_6$ of the shift register 51 and is capable of detecting a bit pattern '010010' in the cells $Y_4$ to $Y_9$ of the shift register 51.

Upon detection of the '010010' bitpattern, the detector circuit 53 generates a control signal on its output $o_2$, and upon detection of a '010' bit pattern in the cells $Y_4$, $Y_5$ and $Y_6$, whilst there is no '010' bit pattern in the cells $Y_7$, $Y_8$ and $Y_9$, it generates a control signal on its output $o_1$.

In the absence of the control signals, the logic circuit 52 converts the 3-bit channel word stored in the cells $Y_1$, $Y_2$ and $Y_3$ into its corresponding 2-bit source word, as per the conversion table I, and supplies the 2-bit source word to the cells $x_1$ and $x_2$. In the presence of the control signal at the input $c_1$, the logic circuit 52 converts the block of two 3-bit channel words stored in the cells $Y_1$ to $Y_6$ into a block of two 2-bit source words, as per the conversion table II, and supplies the two 2-bit source words to the cells $X_1$ to $X_4$. In the presence of the control signal at the input $c_1$, the logic circuit 52 converts the block of three 3-bit channel words stored in the cells $Y_1$ to $Y_9$ into a block of three 2-bit source words, as per the conversion table III, and supplies the three 2-bit source words to the cells $X_1$ to $X_6$. In this way, the serial datastream of the channel signal is converted into the serial datastream of the source signal.

Other sync words that could be used in a parity preserving encoding device, such as the device described above, will be discussed below. Instead of the 15-bit sync word described above, a 16-bit sync word could be used that equals '0100000000100100', or a 17-bit sync word that equals '01000000001001000', or an 18-bit sync word that equals '010000000010010000'. The three sync words described here may lead to a violation of the k-constraint, when concatenating the sync word with a following 3-bit channel word, more specifically, the channel word obtained from the source word '11' in accordance with table I above. Such concatenation would lead to a sequence:

'0100000000100100 000'.

Suppose that the next two source words are the words '10 00'. The concatenation of the sync word with the group of channel words obtained from converting the '10 00' source word sequence, would lead to the following sequence:

'0100000000100100 000 000 010', see table II. This sequence violates the k=8 constraint.

In order to solve this, one could modify table I, in all cases when a '11' source word appears directly after the sync word, so that the source word '11' is converted into the channel word '010'. In a different solution, the conversion from '11' into '010' is only carried out, when indeed a k-constraint violation would occur with unmodified conversion.

Whilst the invention has been described with reference to preferred embodiments thereof, it is to be understood that these are not limitative examples. Thus, various modifications may become apparent to those skilled in the art, without departing from the scope of the invention, as defined in the claims.

Further, the invention lies in each and every novel feature or combination of features.

What is claimed is:

1. A device comprising:
    converting means for converting a block of p consecutive n-bit source words in a stream of databits of a binary source signal into a corresponding block of p consecutive m-bit channel words in a stream of databits of a binary channel signal satisfying a predetermined (d,k) constraint that a minimum of d 'zeros' and a maximum of k 'zeros' are present between consecutive 'ones', such that the conversion for each block of p consecutive n-bit source words is substantially parity preserving, where n, m and p are integers, m>n≧1, p≧1, and where p can vary; and sync word generator means for generating a q-bit sync word, the sync word also satisfying the (d,k) constraint, the sync word starting with a '0' bit and ending with a '0' bit, the device further comprising merging means for merging the sync word in the stream of databits of the binary channel signal, and that q is an integer value larger than k.

2. The device of claim 1, in which d=1 and k=8.

3. The device of claim 2, in which, n=2.

4. The device of claim 3, wherein the converting means convert 2-bit source words into corresponding 3-bit channel words, so as to obtain a channel signal in the form of a (d,k) sequence for which holds that d=1, the device further comprising means for detecting the position in the bitstream of the source signal where encoding of single 2-bit source words into corresponding single channel words would lead to a violation of the d-constraint at the channel word boundaries and for supplying a control signal in response to the detection, in which, in the absence of the control signal, the converting means convert single 2-bit source words into corresponding single 3-bit channel words, such that the conversion for each 2-bit source word is parity preserving.

5. The device of claim 4, wherein, in the presence of the control signal, occurring during the conversion of two consecutive source words, the converting means convert a block of the two consecutive 2-bit source words into a block of two corresponding 3-bit channel words, such that one of the two source words in the block of source words is converted into a 3-bit channel word which is not identical to one of the four channel words $CW_1$ to $CW_4$, in order to preserve the d=1 constraint, in which, in the presence of the control signal, the converting means are further adapted to convert the block of the two subsequent 2-bit source words into a corresponding block of two subsequent 3-bit channel words, such that the conversion for the block of two subsequent 2-bit source words is parity preserving.

6. The device of claim 5, where k has a value larger than 5, the device being further provided with means for detecting the position in the bitstream of the source signal where encoding of single 2-bit source words into single 3-bit channel words would lead to a violation of the k-constraint and for supplying a second control signal in response to the detection, in which, in the presence of the second control signal, occurring during the conversion of three consecutive 2-bit source words, the converting means convert a block of the three consecutive 2-bit source words into a block of corresponding three consecutive 3-bit channel words, such that the conversion for the block of three 2-bit source words is parity preserving, the converting means are further adapted to convert two of the three source words in the block into corresponding 3-bit channel words not identical to the four channel words $CW_1$ to $CW_4$, in order to preserve the k constraint.

7. The device of claim 6, in which, the converting means convert blocks of three consecutive 2-bit source words into blocks of three consecutive 3-bit channel words in accordance with the coding given in the following table:

| block of 3 source words | block of 3 channel words |
|---|---|
| 11 11 11 | 000 010 010 |
| 11 11 10 | 001 010 010 |
| 01 11 10 | 101 010 010 |
| 01 11 11 | 100 010 010. |

8. The device of claim 5, in which, the converting means convert the blocks of two consecutive 2-bit source words into the blocks of two consecutive 3-bit channel words in accordance with the coding given in the following table:

| block of 2 source words | block of 2 channel words |
|---|---|
| 00 00 | 100 010 |
| 00 01 | 101 010 |
| 10 00 | 000 010 |
| 10 01 | 001 010. |

9. The device of claim 3, in which, the device is adapted to convert single source words into corresponding single channel words in accordance with the following table:

| source word | | channel word | |
|---|---|---|---|
| $SW_1$ | 00 | $CW_1$ | 101 |
| $SW_2$ | 01 | $CW_2$ | 100 |
| $SW_3$ | 10 | $CW_3$ | 001 |
| $SW_4$ | 11 | $CW_4$ | 000. |

10. The device of claim 9, in which, if the 2-bit source word directly following the sync word inserted in the channel signal equals '11', the device is adapted to convert the source word '11' into the channel word '010'.

11. The device of claim 1, wherein $d \geq 1$, in which the sync word starts with a '01' bitsequence and ends with a '100' sequence.

12. The device of claim 11, in which q=16.

13. The device of claim 11, in which the sync word equals 0100000000100100.

14. The device of claim 1, wherein $d \geq 1$, in which the sync word starts with a '01' bitsequence and ends with a '1000' sequence.

15. The device of claim 14, in which q=17.

16. The device of claim 14, in which the sync word equals 01000000001001000.

17. The device of claim 1, wherein $d \geq =1$, in which the sync word starts with a '01' bitsequence and ends with a '10000' sequence.

18. The device of claim 17, in which q=18.

19. The device of claim 17 in which the sync word equals 010000000010010000.

20. The device of claim 1, wherein $d \geq 1$, in which the sync word starts with a '01' bitsequence and ends with a '10' sequence.

21. The device of claim 1, in which q=2k−1.

22. The device of claim 1, in which q=15.

23. The device of claim 1, in which the sync word equals 010000000010010.

24. The device of claim 1, in which, m=n+1.

25. A recording device comprising:
converting means for converting a block of p consecutive n-bit source words in a stream of databits of a binary source signal into a corresponding block of p consecutive m-bit channel words in a stream of databits of a binary channel signal satisfying a predetermined (d,k) constraint that a minimum of d 'zeros' and a maximum of k 'zeros' are present between consecutive 'ones', such that the conversion for each block of p consecutive n-bit source words is substantially parity preserving, where n, m and p are integers, m>n≧1, p≧1, and where p can vary;

sync word generator means for generating a q-bit sync word, the sync word also satisfying the (d,k) constraint, the sync word starting with a '0' bit and ending with a '0' bit, the device further comprising merging means for merging the sync word in the stream of databits of the binary channel signal, and that q is an integer value larger than k;

writing means for writing the channel signal generated by the encoding device in a track on a record carrier.

26. A record carrier obtained with the recording device of claim 25.

27. The record carrier of claim 26, in which the record carrier is an optical record carrier.

28. A device comprising:

deconverting means for deconverting a block of p consecutive channel words in a stream of databits of a binary channel signal satisfying a (d,k) constraint that a minimum of d 'zeros' and a maximum of k 'zeros' are present between consecutive 'ones', into a corresponding block of p consecutive source words in a stream of databits of a binary source signal, such that the conversion for each block is parity preserving, where n, m and p are integers, m>n, p≧1, and where p can vary; and means for detecting the presence of a q-bit sync word in the stream of data bits of a binary channel signal, the sync word also satisfying the (d,k) constraint, the sync word starting with a '0' bit and ending with a '0' bit, and that d, k and q are integers larger than 0 and that q is larger than k.

29. The device of claim 28, wherein d≧1, in which the sync word starts with a '01' bitsequence and ends with a '10' sequence.

30. The device of claim 29, in which q=15.

31. The device of claim 28, wherein d≧1, in which the sync word starts with a '01' bitsequence and ends with a '100' sequence.

32. The device of claim 31, in which q=16.

33. The device of claim 31, in which the sync word equals 0100000000100100.

34. The device of claim 28, wherein d≧1, in which the sync word starts with a '01' bitsequence and ends with a '1000' sequence.

35. The device of claim 34, in which q=17.

36. The device of claim 34 in which the sync word equals 01000000001001000.

37. The device of claim 28, wherein d≧=1, in which the sync word starts with a '01' bitsequence and ends with a '10000' sequence.

38. The device of claim 37, in which q=18.

39. The device of claim 37, in which the sync word equals 010000000010010000.

40. The device of claim 28, in which q=2k−1.

41. The device of claim 28, in which the sync word equals 010000000010010.

42. A reproduction device comprising:

reading means for reading a stream of databits of a binary channel signal from a track on a record carrier deconverting means for deconverting a block of p consecutive channel words of the channel signal satisfying a (d,k) constraint that a minimum of d 'zeros' and a maximum of k 'zeros' are present between consecutive 'ones', into a corresponding block of p consecutive source words in a stream of databits of a binary source signal, such that the conversion for each block is parity preserving, where n, m and p are integers, m>n, p≧1, and where p can vary;

means for detecting the presence of a q-bit sync word in the stream of databits of the binary channel signal, the sync word also satisfying the (d,k) constraint, the sync word starting with a '0' bit and ending with a '0' bit, and that d, k and q are integers larger than 0 and that q is larger than k.

43. A method of encoding, comprising the steps of:

converting-bit source words in a stream of databits of a binary source signal into corresponding m-bit channel words in a stream of databits of a binary channel signal satisfying a predetermined (d,k) constraint that a minimum of d 'zeros' and a maximum of k 'zeros' are present between consecutive 'ones', such that a block of p consecutive n-bit source words is converted into a corresponding block of p consecutive m-bit channel words, such that the conversion for each block of p consecutive n-bit source words is parity preserving, where n, m and p are integers, m>n≧1, p≧1, and where p can vary; and generating a q-bit sync word, the sync word also satisfying the (d,k) constraint, the the sync word starting with a '0' bit and ending with a '0' bit, and comprises the step of merging the sync word in the stream of databits of the binary channel signal, and that q is an integer value larger than k.

44. The method of claim 43, further comprising the step of recording the channel signal in a track on a record carrier.

45. A record carrier produced by the method of claim 44.

46. The record carrier of claim 45, in which the record carrier is an optical record carrier.

* * * * *